United States Patent [19]

Tanaka et al.

[11] Patent Number: 5,349,242

[45] Date of Patent: * Sep. 20, 1994

[54] BIDIRECTIONAL SWITCH CIRCUIT WITH AUTOMATIC RETURN-CURRENT PATH SELECTOR

[75] Inventors: Minoru Tanaka, Yokohama; Hiroshi Tanimoto, Kawasaki, both of Japan

[73] Assignee: Kabushiki Kaisha Toshiba, Kawasaki, Japan

[ * ] Notice: The portion of the term of this patent subsequent to Aug. 17, 2010 has been disclaimed.

[21] Appl. No.: 22,266

[22] Filed: Feb. 25, 1993

Related U.S. Application Data

[63] Continuation-in-part of Ser. No. 792,926, Nov. 15, 1991, Pat. No. 5,237,211.

[30] Foreign Application Priority Data

Nov. 15, 1990 [JP] Japan .................................. 2-307310
May 14, 1991 [JP] Japan .................................. 3-107881

[51] Int. Cl.$^5$ ............................................. H03K 17/56
[52] U.S. Cl. ........................................ 307/249; 307/241; 307/242; 307/254; 307/573; 307/636
[58] Field of Search .............. 307/241, 242, 254, 256, 307/259, 260, 571, 573, 113, 311, 631, 632, 645, 646; 379/399, 413

[56] References Cited

U.S. PATENT DOCUMENTS

| | | | |
|---|---|---|---|
| 3,619,656 | 11/1971 | Domke ................................. | 307/632 |
| 3,731,182 | 5/1973 | Hirono et al. ....................... | 307/632 |
| 3,735,154 | 5/1973 | Meeker et al. ...................... | 307/260 |
| 3,906,167 | 9/1975 | Baker ................................... | 374/413 |
| 4,041,255 | 8/1977 | Cambridge et al. ................ | 379/399 |
| 4,069,446 | 1/1978 | Yonehara ............................ | 307/632 |
| 4,350,949 | 9/1982 | Fujita .................................. | 307/255 |
| 4,429,186 | 1/1984 | Gartner .............................. | 374/413 |
| 5,124,595 | 6/1992 | Mandelcorn ....................... | 307/571 |
| 5,218,246 | 6/1993 | Lee et al. ............................ | 307/471 |

OTHER PUBLICATIONS

ISPSD, Gammel et al., "A High Voltage Line Interface Circuit for PBX Applications", 1988, pp. 117–120.
Sedra et al., "Microelectronic Circuits", 1982, pp. 332–335.

*Primary Examiner*—Timothy P. Callahan
*Assistant Examiner*—Terry D. Cunningham
*Attorney, Agent, or Firm*—Oblon, Spivak, McClelland, Maier & Neustadt

[57] ABSTRACT

A bidirectional switch circuit includes a parallel circuit of two unidirectional switch devices which are connected between a first and a second external current terminals. These switch devices are arranged to be reverse to each other in their current-forwarding direction. The switch devices are electrically biased by a single power supply unit, and turn on alternately in accordance with the potential difference between the external terminals. Each switch device may be an insulated gate bipolar transistor (IGBT), which is driven by a bias voltage generator including a resistor. A current flow controller is connected between the power supply unit and the IGBTs, for selectively supplying a control current to one of the IGBTs. A return-current path selector is connected between the external terminals, and has an output connected to the power supply unit through a return path line. The selector automatically performs a return-path changeover operation for a return-current of one of the switch devices being presently turned on.

9 Claims, 6 Drawing Sheets

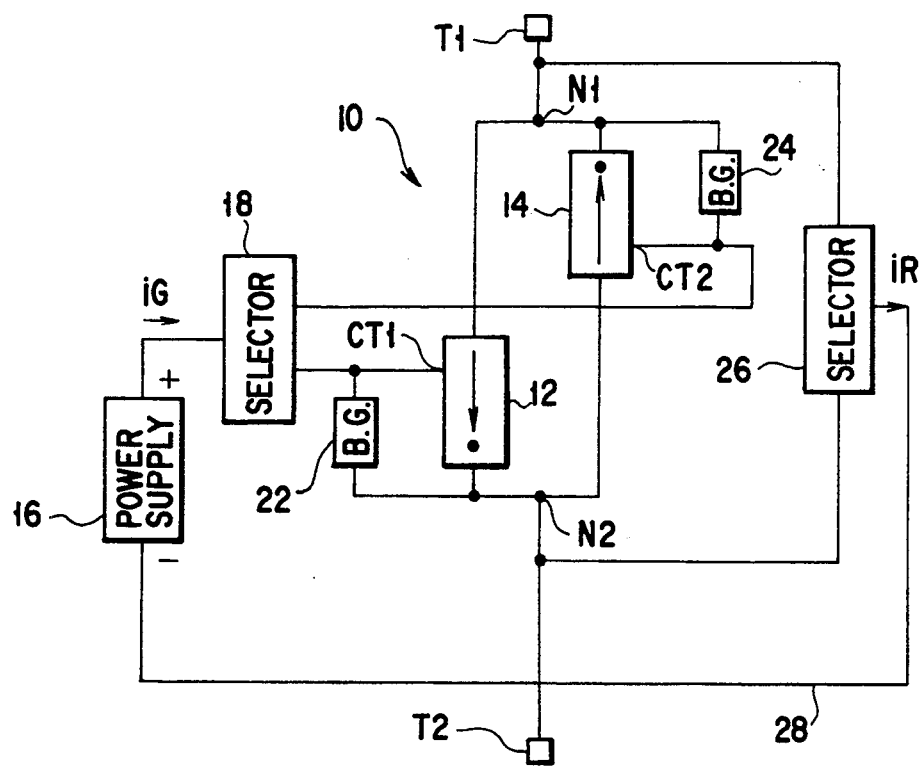
F I G. 1
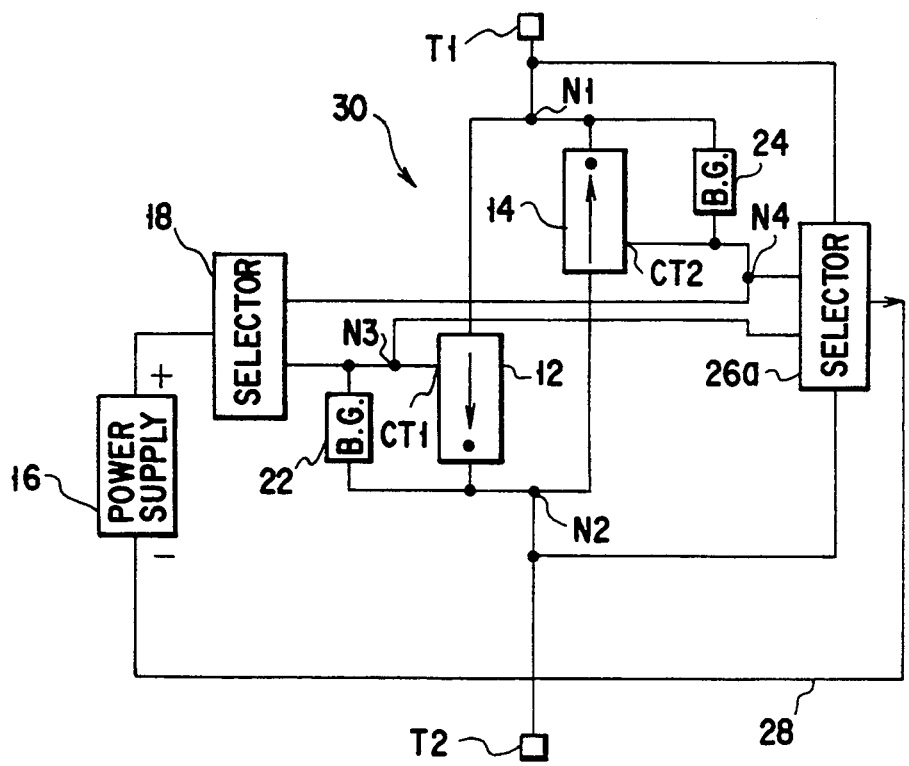
F I G. 2

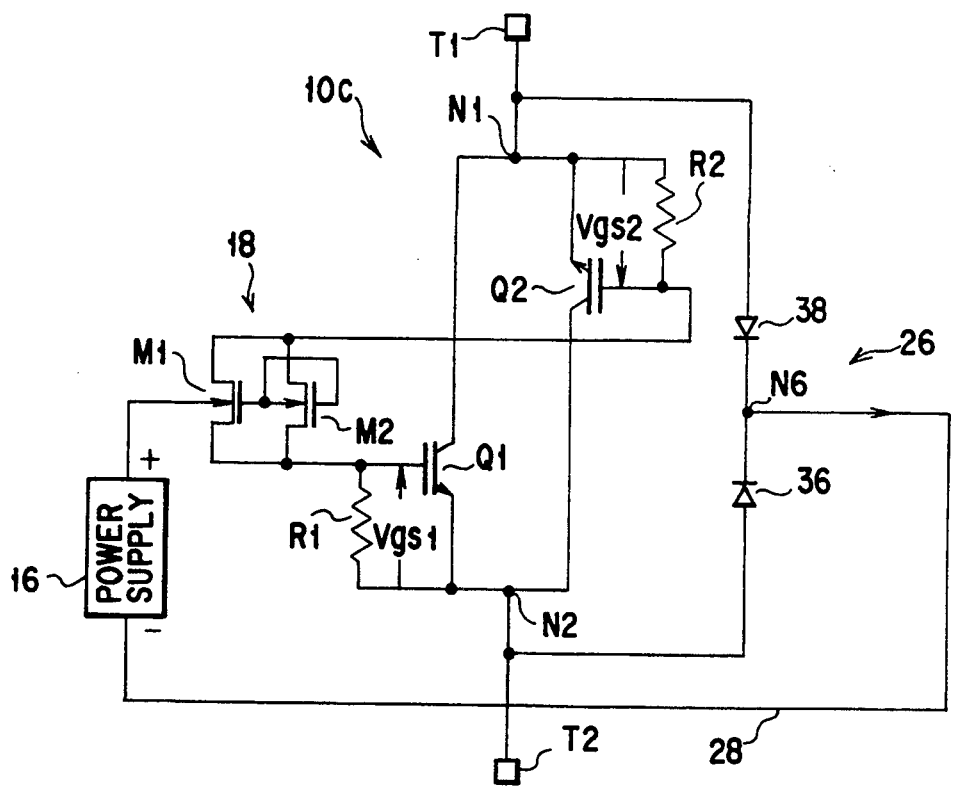
F I G. 5
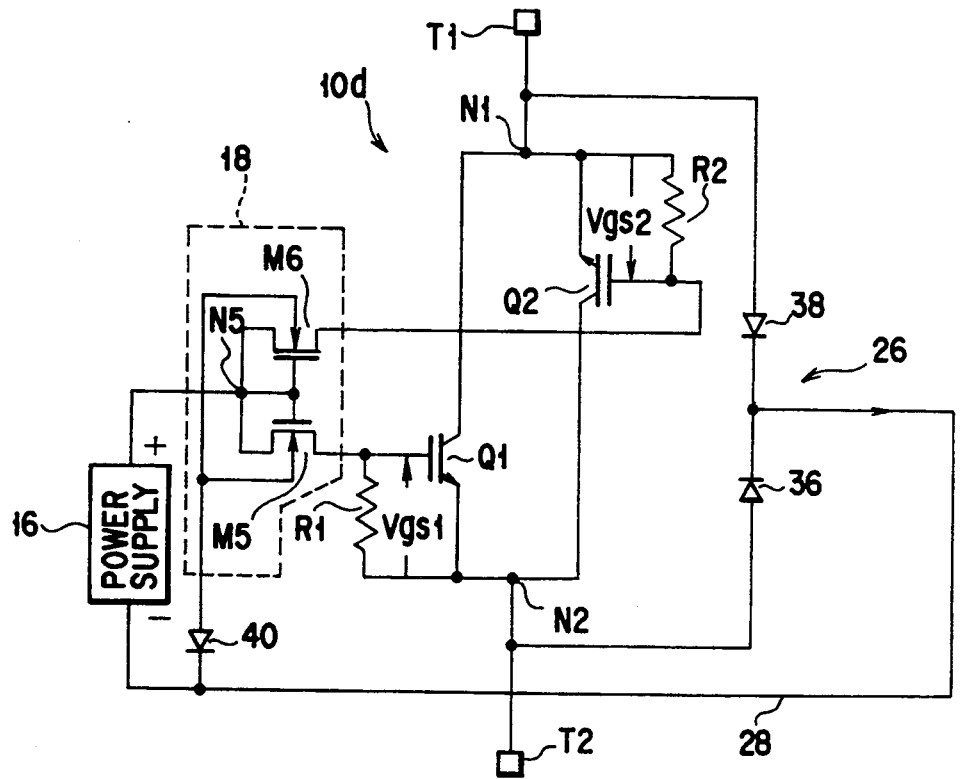
F I G. 6

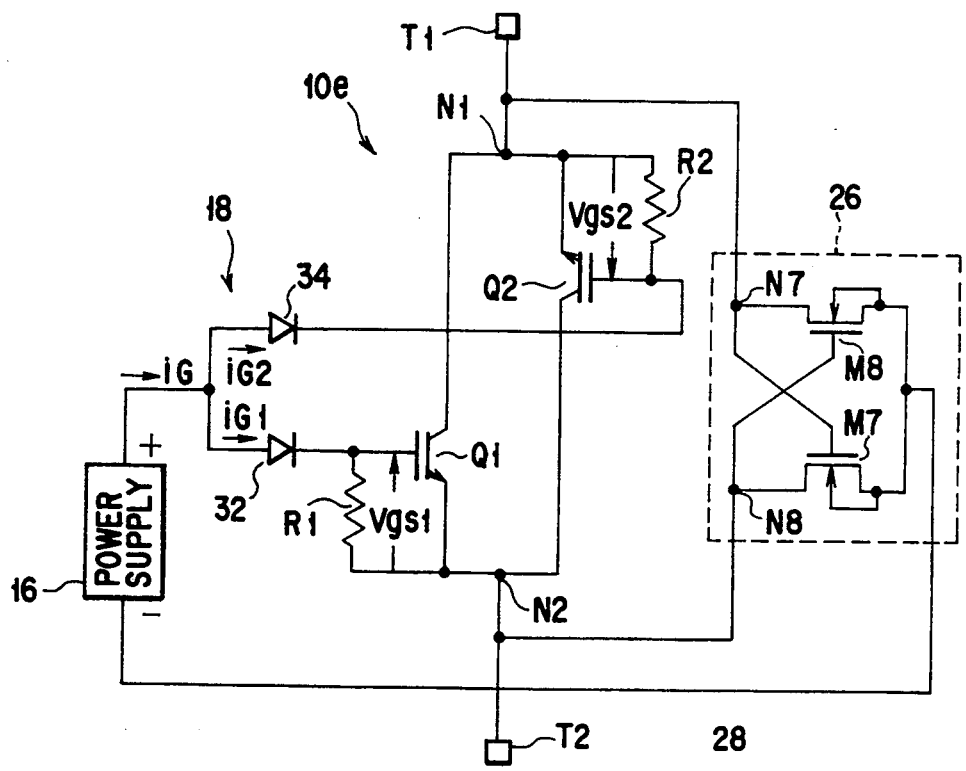
F I G. 7
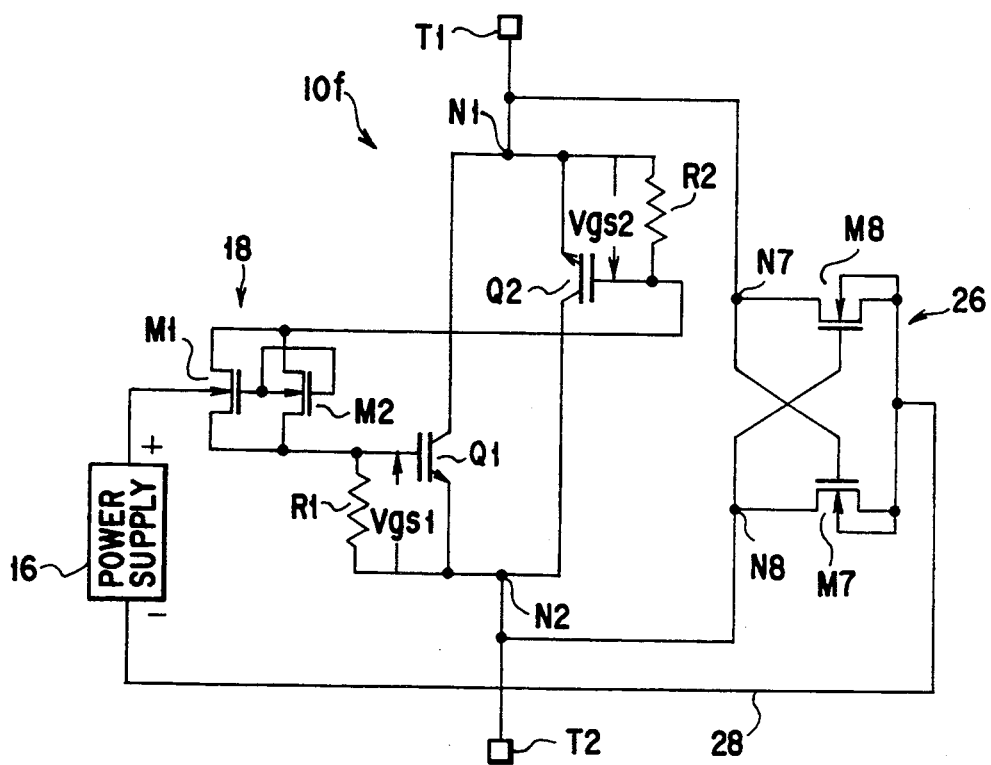
F I G. 8

5,349,242

BIDIRECTIONAL SWITCH CIRCUIT WITH AUTOMATIC RETURN-CURRENT PATH SELECTOR

CROSS-REFERENCES TO THE RELATED APPLICATIONS

This application is a continuation-in-part of U.S. patent application Ser. No. 792,926, filed on Nov. 15, 1991, now U.S. Pat. No. 5,237,211.

BACKGROUND OF THE INVENTION

1. Field of the Invention

The present invention relates generally to integrated circuits, and more particularly to a bidirectional switch circuitry for use in a floating circuit system.

2. Description of the Related Art

Recently, bidirectional switch circuits are becoming more widely used in the floating circuit systems as the speed and cost advantages of these systems increase. Typically, in the subscriber line-interface circuit (SLIC), a bidirectional switch integrated circuit is very important to switch bidirectionally the transmission paths of communication signals between a private branch exchange (PBX) and a terminal unit such as a telephone.

In the floating circuit system, it is known that a pair of unidirectional switch devices are combined to achieve a bidirectional switch function. The paired unidirectional switch devices are connected in parallel with each other to have the reverse current-forward directions. Generally, these switch devices are provided with two separate power supply units as the current drivers therefor, respectively. The power supply units are same as each other in the circuit configuration thereof.

The conventional bidirectional switch circuits suffer from the following problem: The employment of two power supply units causes the switch circuit to increase in the number of circuit components required, which are mounted at higher integration density on a semiconductor chip substrate of limited size. Obviously, this necessitates the use of a larger substrate, which results in the integrated circuit being increased in the manufacturing cost.

SUMMARY OF THE INVENTION

It is therefore an object of the present invention to provide a new and improved bidirectional switch circuit which can attain an excellent switch function.

In accordance with the object, the present invention is drawn to a specific bidirectional switch circuit adapted to be connected to a first and a second external terminal. The circuit includes a first unidirectional switch device coupled between the first and second terminals, and a second unidirectional switch device connected in parallel with the first switch device. The first and second switch devices are reverse to each other in a current-forwarding direction thereof. A power supply device is provided for electrically basing the first and second switch devices. A first current flow controller is coupled to the power supply device and the first and second switch devices, for allowing a current output of the power supply device to be selectively supplied to the first and second switch devices. A second current flow controller is connected to the first and second terminals and having an output connected to the power supply device, for forming, when either one of the first and second switch devices turns on, a return path by which a return-current thereof is fed back from the output to the power supply device.

The foregoing and other objects, features, and advantages of the invention will become apparent from the following more particular description of preferred embodiments of the invention, as illustrated in the accompanying drawings.

BRIEF DESCRIPTION OF THE DRAWINGS

FIG. 1 is a circuit diagram of a bidirectional switch circuitry in accordance with one embodiment of the present invention.

FIG. 2 is a circuit diagram of a bidirectional switch circuitry in accordance with another embodiment of the present invention.

FIGS. 3 through 12 are diagram showing bidirectional switch circuits in accordance with further embodiments of the invention.

DETAILED DESCRIPTION OF THE PREFERRED EMBODIMENTS

Figure 3:
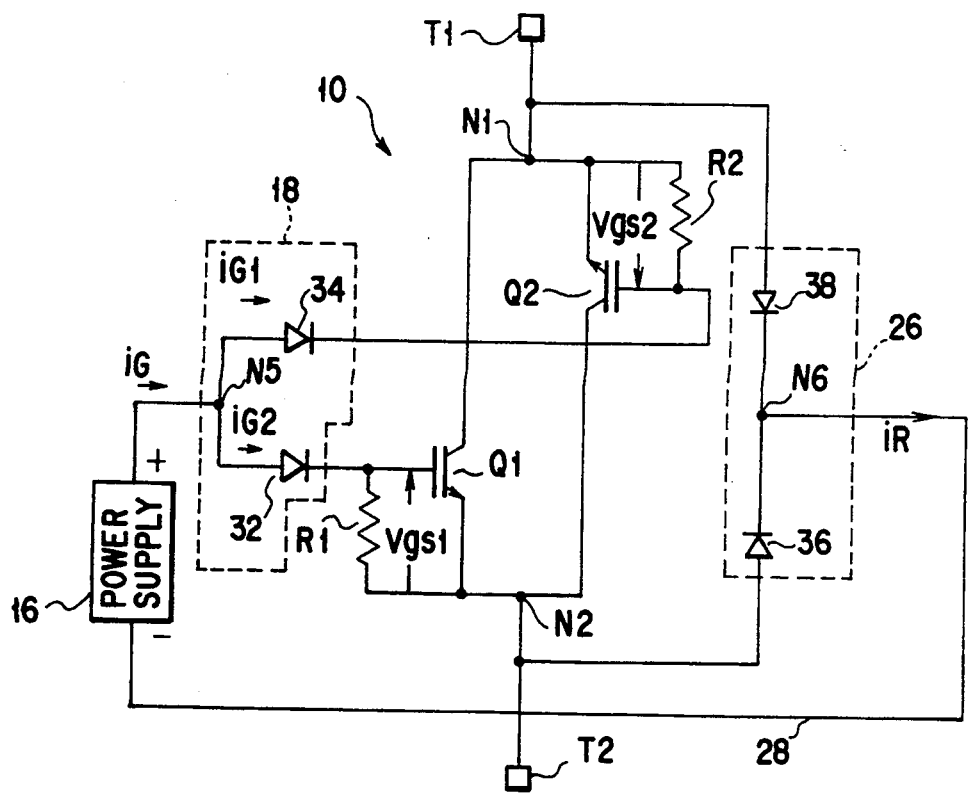

Referring now to FIG. 1, a bidirectional switch circuit in accordance with one preferred embodiment of the invention is generally designated by the numeral 10. The switch circuit 10 includes first and second external current-flow terminals T1 and T2, at which the circuit 110 is associated with an external floating circuit system (not shown). Terminals T1, T2 may be called the "control terminals." The term "floating" is defined as a specific electrical condition wherein circuit nodes in question are DC-separated or electrically independent from the remaining portions of the circuit. A pair of unidirectional switch devices 12, 14 are connected in parallel with each other between terminals T1, T2. Switch devices 12, 14 are opposite to each other in current-forwarding (signal transmission) direction. In FIG. 1 the current-forward directions of these devices are designated by arrows for the purposes of illustration only.

Each of the switch devices 12, 14 is a "one-way" or unidirectional current-flow control device, which can control the flow of current in the forward direction only, and prevents the current flow in the reverse direction; in this sense, devices 12, 14 are called the "unidirectional" switches. When the first external terminal T1 is potentially greater than the second terminal T2, first switch device 12 becomes operative and turns on causing current to flow from terminal T1 to terminal T2. On the other hand, when second terminal T2 is potentially greater than first terminal T1, second switch 14 then turns on alternatively, causing current to flow from terminal T1 to terminal T2. First and second switches 12, 14 may be well-known solid-state "charge-transfer actuable" devices such as transistors, which include ordinary bipolar transistors, insulated gate bipolar transistors (IGBTs) or the like. Typically, the use of IGBTs are recommendable for bidirectional switch circuit 10.

The bidirectional switch circuit 10 is provided with a single direct-current (DC) power supply unit 16 of the floating type. Power supply unit 16 is connected with the first and second unidirectional switch devices 12, 14 in a manner described as follows. First and second switch devices 12, 14 have switching-control inputs CT1, CT2.

The power supply unit 16 is connected to control inputs CT1, CT2 of switches 12, 14 by way of a current flow controller circuit 18. The circuit 18 has an input coupled to the positive polarity terminal of power supply unit 16, and two first and second outputs coupled to control inputs CT1, CT2 of switch devices 12, 14 as shown in FIG. 1. Circuit 18 will be referred to as the "current-flow selector circuit" hereinafter. Principally, this selector circuit 18 causes a control current iG fed by power supply 16 to be selectively supplied to the first and second unidirectional switch devices 12, 14. In other words, selector 18 supplies a necessary control current iG1 or iG2 to one of switch devices 12, 14 which is presently turned on. Selector circuit 18 allows the control current from power supply 16 to flow into the terminal T1 or T2; however, selector 18 prevents or eliminates the occurrence of a feed-through current (or, current backflow) between the control inputs CT1 and CT2 of switch devices 12, 14.

The first and second switches 12, 14 are associated at their switch-control inputs CT1, CT2 with first and second bias-voltage generating circuits 22, 24. The bias voltage generator 22 is connected to the control input CT1 of first switch 12 and second terminal T2, and is provided by power supply unit 16 with a switching-control current to generate a suitable bias voltage, which is then supplied to first switch 12. The other bias voltage generator 24 is connected to control input CT2 of second switch 14 and terminal T1, and receives a control current supplied by power supply 16, thereby to provide the second switch 14 with a bias voltage of selected potential level, when first terminal T1 is at a high potential, selector 18 prevents the control current supplied by power supply 16 from flowing in bias voltage generator 24 associated with second switch 14. On the other hand, when second terminal T2 is at the high potential, selector 18 prevents the control current from flowing in bias voltage generator 22 associated with first switch 12.

As shown in FIG. 1, a second current-path selecting circuit 26 is connected between the first and second terminals T1, T2. Second selector circuit 26 has an output coupled by a wiring line 28 to the negative polarity terminal of the power supply unit 16. Second selector circuit 26 serves as a "return-current path selector." This return-current path selector 26 is coupled between circuit nodes N1, N2 of the parallel-connected switch devices 12, 14 having reverse current-forwarding directions. Return-current path selector 26 is electrically driven by power supply 16. Return-current path selector 26 is one of the circuit line (path) changeover device; basically, it changes the internal circuit connection of bidirectional switch circuit 10 so as to facilitate the control current to flow back toward power supply 16 from one of terminals T1, T2, which is potentially lower than the other. Under control of selector 26, the control current iG supplied by power supply 16 to first and second bias voltage generators 22, 24 can be successfully returned as a return-current iR to power supply 16. It is thus possible to prevent the control current flowing in bias voltage generators 22, 24 from leaking into an external signal transmission line-path that is connected with circuit 10 at terminals T1, T2.

A bidirectional switch circuit 30 shown in FIG. 2 is similar to that of FIG. 1 with the selector 26 being replaced with a return-current path selector circuit 26a, which is modified to have first and second inputs coupled at circuit nodes N3, N4 to the control inputs CT1, CT2 of the unidirectional switch devices 12, 14. This return-current path selector 26a is featured in that the control of its switching operation is responsive to the control signals for switch devices 12, 14 associated therewith.

An exemplary detailed circuit configuration of the bidirectional switch circuit 10 of FIG. 1 is illustrated in FIG. 3, wherein N-channel type insulated-gate bipolar transistors (IGBTs) Q1, Q2 are employed as the first and second unidirectional switch devices 12, 14. Bias voltage generators 22, 24 include resistors R1, R2. The first selector circuit 18 includes two diode devices 32, 34. Diode 32 is connected between a circuit node N5 being coupled to the positive terminal of the power supply unit 16 and the insulated gate electrode of IGBT Q1. Diode 34 is connected between node N5 and the insulated gate electrode of IGBT Q2. The return-current path selector 26 includes diodes 36, 38 being opposite to each other in the forward-current flow direction. Diodes 36, 38 have current inputs coupled to terminals T1, T2, respectively. The forward current outputs of diodes 36, 38 are coupled to each other at a circuit node N6, which is connected by the current flow line 28 to the negative polarity terminal of power supply unit 16. Line 28 acts as a return-current flow line, which forms a return path for causing a return-current iR to flow back to power supply unit 16. Power supply 16 may include a known bridge circuit (not shown) consisting of four semiconductor diodes connected to provide a full-wave rectifier circuitry. It is recommendable that a specific power supply device being inherently greater in internal impedance is employed as power supply unit 16.

The operation of the bidirectional switch circuit 10 of FIG. 3 is as follows. A current that flows between the first and second external terminals T1, T2 is controlled by the switching operations of IGBTs Q1, Q2. This can be said because a feed-through current between terminals T1, T2 by way of diodes 32, 34 does not flow due to the fact that these diodes are reverse-connected or reverse-biased. A feed-through current between terminals T1, T2 through diodes 36, 38 does not flow due to the blocking of these diodes.

The floating type DC power supply 16 constantly supplies a DC current iG to the IGBTs Q1, Q2 serving as the first and second IGBT switch devices 12, 14 of FIG. 1. When the first and second external terminals T1, T2 are potentially equivalent to each other, the flow of control current iG is branched by parallel-connected diodes 32, 34 so that a switching-control current iG1 is supplied to the gate of first IGBT switch Q1, and a switching-control current iG2 is given to the gate of second IGBT switch Q2 as shown in FIG. 3. The resistors R1, R2 associated therewith supply IGBT switches Q1, Q2 with bias voltages Vgs1, Vgs2, respectively.

When a potential difference is generated between the first and second terminals T1, T2, either one of first and second IGBT switches Q1, Q2 is driven to turn on in accordance with the potential relationship between first and second terminals T1, T2. Assume that the bidirectional switch circuit 10 is initially inoperative (turned off), and that first terminal T1 is potentially greater than second terminal T2. Under such a condition, diode 34 is reverse-biased. This may be easily understood by tracing a circuit path including terminal T1, node N1, resistor R2, diode 34, diode 32, resistor R1, node N2 and terminal T2 in this order.

The reverse-biased diode 36 is much greater in impedance than the forward-biased diode 38. Thus, the potential at the diode-intermediate node N6 becomes high to be same as that of the terminal T1. The voltage potential at the common node N5 of the diodes 32, 34 of the first selector circuit 18, which diodes are reverse in connecting direction to diodes 36, 38 of second selector circuit 26, approximates the potential at the second terminal T2. When a control current iG is supplied by the power supply 16, since this control current is generated with the potential at the negative polarity terminal of power supply 16 being as a reference level, the diodes 32, 34 begin to be supplied with power at a voltage higher than that of terminal T1. This results in that control current iG flows in the both of diodes 32, 34. Under such a condition, second IGBT switch Q2, which is continued to be reverse-biased, is prevented from turning on. Therefore, terminals T1, T2 are electrically coupled (short-circuited) to each other only by the first IGBT switch Q1 being presently turned on.

At this time, regarding the return-current path selector 26, the diode 36 is reverse-biased, while diode 38 is forward-biased. The control current iG1 flowing in resistor R1 is thus guided to flow into return-path line 28 via diode 36, and is then fed back to power supply 16. In other words, when IGBT switch Q1 turns on, return-current path selector 26 automatically performs, in response to this turn-on operation of switch Q1, a return-path line changeover operation such that node N2 is connected to return-path line 28 while node N1 is electrically separated.

The fact that the reverse-biased diode 36 is much greater in impedance than the forward-biased diode 38 results in the potential at the diode-intermediate node N6 being as high as that of the terminal T1 as described previously. Due to the high potential at node N6, there is defined a forward bias path through terminal T1, diode 38, return current path line 28, power supply 16 and diode 32 in this order. By taking this into consideration, in the case wherein the second selector circuit 26 uses diodes 36, 38 as shown in FIG. 3, power supply 16 is preferably constituted by a specific type of current source having an increased internal impedance. Alternatively, circuit 10 should be so arranged as to force power supply 16 to be electrically disconnected when power supply 16 is under the no power-feed condition. The achievement of such circuit design may be done by any person skilled in the art without requiring any inventive activity.

After the first IGBT switch Q1 is turned on, current begins to flow from terminal T1 to terminal T2 through IGBT switch Q1. IGBT switch Q1 exhibits its inherent on-voltage. Typically, this voltage ranges from 1.0 to 1.5 volts. With the presence of on-voltage, the potential difference between terminals T1, T2 will never drop to zero (the ground potential). However, when the potential at terminal T1 is further decreased, diode 34 will be forward-biased. In response to this, control current iG2 begins to flow in the other IGBT switch Q2 also. This current iG2 flows into resistor R2, and then into terminal T2 through IGBT switch Q1 that is kept conductive (turned on). As a result, forward-voltage Vgs2 is also generated between the gate and the source of second IGBT switch Q2. This switch Q2 does not turn on at this time, since the potential level at terminal T1 is maintained higher than that at terminal T2. Similarly, the control current flowing from the gate of IGBT switch Q2 to the circuit path between terminals T1, T2 flows into the return-path line 28 and is fed back to power supply unit 16.

When the potential relationship between the first and second terminals T1, T2 is opposite to the above case, i.e., second terminal T2 is potentially greater than first terminal T1, principally, the current-controlling operation in this case is substantially the reverse of that described above with respect to the transistors Q1, Q2, and diodes 36, 38.

With the above embodiment, the pair of unidirectional switch devices 12, 14 (Q1, Q2) for performing a bidirectional switch function can be electrically fed or powered by the single power supply unit 16. In addition, the return current iR of switch devices 12, 14 which alternately turn on can be returned automatically and effectively to power supply 16 under the control of return-current path selector 26. It is thus possible to achieve the excellent bidirectional switch circuit 10 in a floating circuit system while minimizing the number of the circuit components being required therein. This can contribute to the improvement in high-density packaging of the bidirectional switch circuit 10 on a one-chip substrate.

Figure 4:
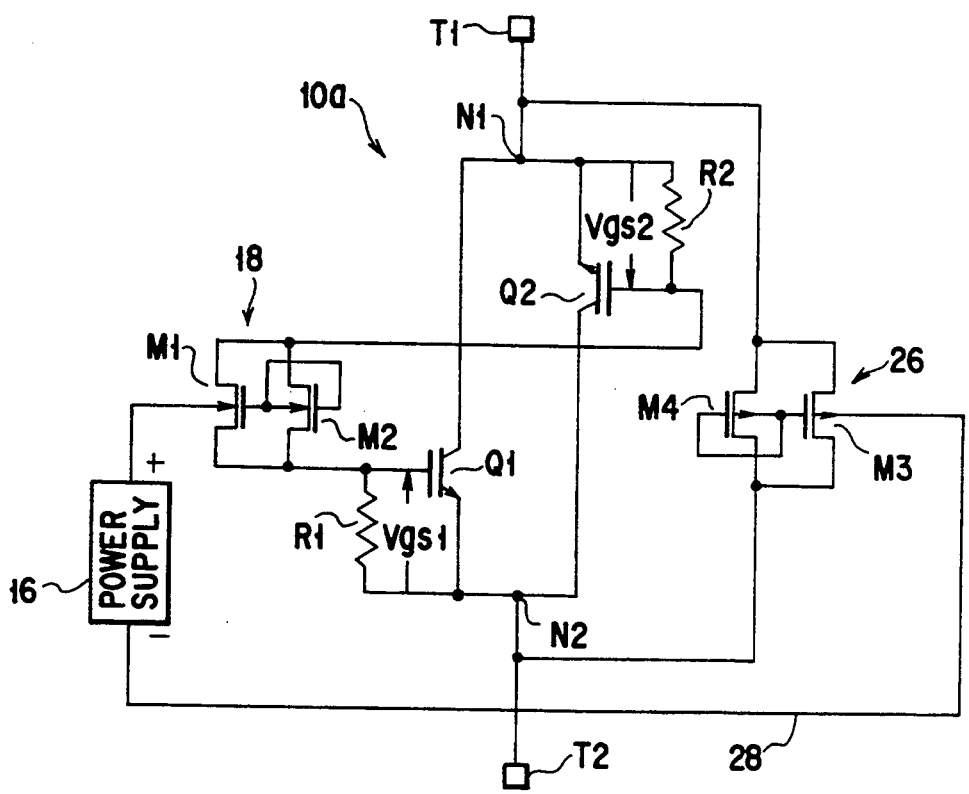

A bidirectional switch circuit 10a shown in FIG. 4 is similar to that of FIG. 3 with the diodes 32, 34, 36, 38 of the first and second selector circuits 18 being replaced with metal oxide semiconductor field effect transistors M1 to M4. More specifically, the first selector circuit 18 includes two N-channel type metal oxide semiconductor field effect transistors or MOSFETs M1, M2. MOSFETs M1, M2 are connected in parallel with each other between the insulated gates of IGBT switch devices Q1, Q2 as shown in FIG. 4. The gate electrodes of MOSFETs M1, M2 are coupled together. The parallel-connected MOSFETs M1, M2 are arranged on the basis of the fact that the electrode portions of diodes 32, 34 of FIG. 3 being commonly coupled to each other at node N5 are made from a P type semiconductor material; node N5 of FIG. 3 may be considered as the "back gate" of MOSFET M1. The opposite electrode portions of diodes 32, 34 are N type semiconductor, which may be assumed to be the drain or the source of N type MOSFET M1. At this time, it is required that the gate of N type MOSFET M1 maintains at a low voltage potential in order to assure that the channel region of MOSFET M1 does not influence the circuitry. To attain this, the other MOSFET M2 is connected in parallel with MOSFET M1, causing the gate voltages of MOSFETs M1, M2 to remain equivalent constantly to the back-gate voltage of MOSFET The second selector circuit 26 includes two parallel-connected P-channel type MOSFETs M3, M4 between the terminals T1, T2. MOSFETs M3, M4 have first current carrying (source or drain) electrodes coupled together to terminal T1, and second current-carrying electrodes coupled to terminal T2. The gate electrodes (back-gates) of MOSFETs M3, M4 are connected together. The channel region of MOSFET M3 is coupled to the negative terminal of the power supply unit 16. The replacement of the diodes 36, 38 of FIG. 3 with such parallel-connected MOSFETs M3, M4 is done on the basis of the fact that the intermediate connection node N6 of diodes 36, 38 is made from the N type semiconductor, and may be considered as an arrangement that this N type semiconductor is replaced with the MOSFET M3. To cause the gate voltage of MOSFET M3 to be kept at a high voltage as required, MOSFET M4 is connected in parallel with MOSFET M3. The basic operation of bidirectional switch circuit 10a using MOSFETs M1–M4 is similar to that of the embodiment shown in FIG. 3.

A bidirectional switch circuit 10c illustrated in FIG. 5 is similar to that of FIG. 3 with the diodes 32, 34 of the first selector circuit 18 being replaced with N-channel type MOSFETs M1, M2 that are connected in parallel with each other in the same manner as has been described with reference to FIG. 4.

A bidirectional switch circuit 10d shown in FIG. 6 is similar to that of FIG. 3 with the diodes 32, 34 of the first selector circuit 18 being replaced by N-channel type MOSFETs M5, M6, respectively. These MOSFETs have gate electrodes coupled together at the node N5, which is connected to the positive terminal of power supply unit 16. The first current-carrying electrodes of MOSFETs M5, M6 are also coupled together at node N5. The second current-carrying electrodes of MOSFETs M5, M6 are coupled to the insulated gates of the IGBT switch devices Q1, Q2, respectively. A diode is connected between the return-path line 28 and a common coupled channel regions of MOSFETs M5, M6.

The employment of the diode 40 is to make stable the operation of the MOSFETs M5, M6; the diode 40 is connected in the forward-bias direction so as to force the back gates thereof to be coupled to the negative terminal of the power supply 16. Thus, the reverse flow of current from power supply 16 toward first selector 18 will no longer take place. MOSFETs M5, M6 is applied at their back-gates with a given voltage potential. In the case where these MOSFETs are used as a four-terminal device, the source and drain of each MOSFET M5, M6 are not specifiable. At this time, the source and drain may be determined depending upon the mutual potential relationship being set presently. In such a case, each MOSFET operates such that one of the current-carrying electrodes which is higher in potential than the other acts as the drain whereas the other of them which is potentially lower serves as the source of it.

The operation of the circuit 10d is as follows. Consider about the case wherein the terminal t1 is potentially greater than terminal T2. The reverse goes with the operation of circuit 10d when terminal T2 is higher in potential than terminal T1.

When the power supply 16 is under the no power-feed condition, the nodes of the MOSFET M6 to be short-circuited are the source and the gate of it. The short-circuiting nodes of the MOSFET M5 are its drain and gate. MOSFET M6 is thus cut off. MOSFET M5 is active. Therefore, any feedthrough current will not flow by way of MOSFETs M5, M6. This forces the off state of terminal T1, T2 to continue.

When the control current iG is supplied by the power supply 16, the input terminal of power supply 16 becomes greater in potential than the terminal T1 due to the fact that the potential at the negative terminal of power supply 16 is substantially equivalent to that of terminal T1. The both of MOSFETs M5, M6 are thus set in the gate-to-drain short-circuiting state. As a result, the control current iG is supplied through both MOSFETs M5, M6 to the insulated gates of IGBT switch devices Q1, Q2. In responding to supplement of control current iG, only one of devices Q1, Q2 that is presently forward-biased is forced to turn on in the same manner as in the circuit 10 of FIG. 3. The other of devices Q1, Q2 remains to be turned off.

A bidirectional switch circuit 10e shown in FIG. 7 is similar to that of FIG. 3 with the diodes 36, 38 of the second selector circuit 26 of FIG. 3 being replaced with N-channel type MOSFETs M7, M8 connected to constitute a flip-flop circuitry. These transistors M7, M8 are connected at their source electrodes by current-flowing line 28 to the negative-polarity terminal of power supply 16. MOSFETs M7, M8 are cross-coupled with each other at the drain electrodes and the gate electrodes thereof, as shown in FIG. 2. A circuit node N7 (the drain electrode of transistor MS) is connected to the first terminal T1, while a circuit node N8 (the drain electrode of transistor M7) is connected to the second terminal T2. The output of return-current path selector 26 is connected to the negative-polarity terminal of power supply 16 via current-flowing line 28.

Assume that the terminal T1 is potentially greater than terminal T2. When the power supply 16 is under the no power-feed condition, terminals T1, T2 are set by diodes 32, 34 in the open state in the same manner as in the circuit 10 of FIG. 3. MOSFETs M7, M8 of selector 26 constitute the flip-flop circuitry as described previously; therefore, MOSFET M7 turns on, whereas MOSFET M8 turns off. The source voltages of MOSFETs M7, MS, that is, the potential at the negative terminal of power supply 16, is substantially equal to that of terminal T2.

When the control current iG is supplied by the power supply 16, the diode 32 is forward-biased. This allows the control current to flow into the control input of the unidirectional IGBT switch device Q1. IGBT device Q1 is then turned on, causing terminals T1, T2 to be electrically coupled to each other. Note that, with this embodiment using the selector 26 having the flip-flop circuit configuration, the potential of power supply 16 is substantially equivalent to that of any one of terminals T1, T2 which is potentially lower than the other when power supply 16 is in the no power-feed state. Therefore, it is not required that power supply 16 is high in internal impedance, and the control using an ordinary voltage source may be available.

A bidirectional switch circuit 10f shown in FIG. 8 is similar to that of FIG. 7 with the diodes 32, 34 being replaced with the MOSFETs M1, M2 shown in FIG. 4.

Figure 9:
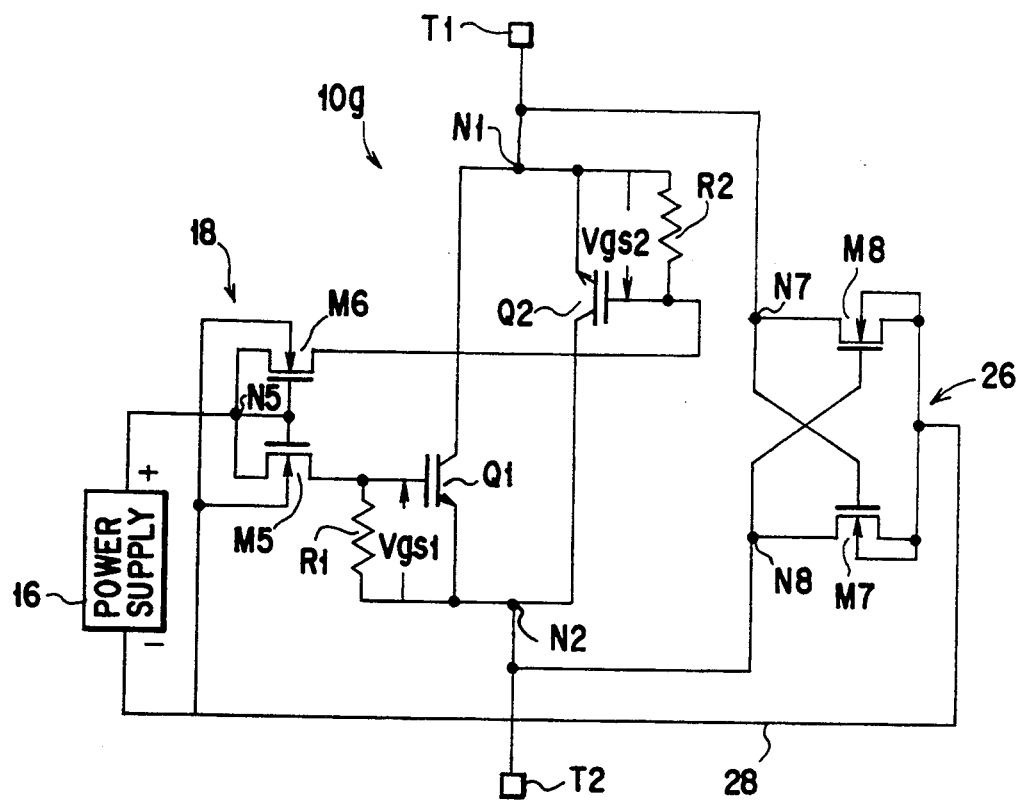

A bidirectional switch circuit 10g illustrated in FIG. 9 is similar to that of FIG. 7 with the diodes 32, 34 being replaced with the MOSFETs M5, M6 of FIG. 6. In the case where terminal T1 is higher in potential than terminal T2, when the power supply 16 is in the no power-feed state, the operation of the circuit 10g is similar to that of the embodiment 10d shown in FIG. 6. The difference in operation of circuit 10g from circuit 10d is as follows: the current reverse-flow preventing diode 40 of FIG. 6 is unnecessary due to the fact that the negative-side potential of power supply 16 is at a low potential to prevent any current from flowing into the back gates of MOSFETs M5, M6. When the control current is output from power supply 16, since MOSFET M6 is cut off, this control current is supplied through MOSFET M5 to IGBT switch device Q1. This causes terminals T1, T2 to be in the short-circuited state.

Figure 10:
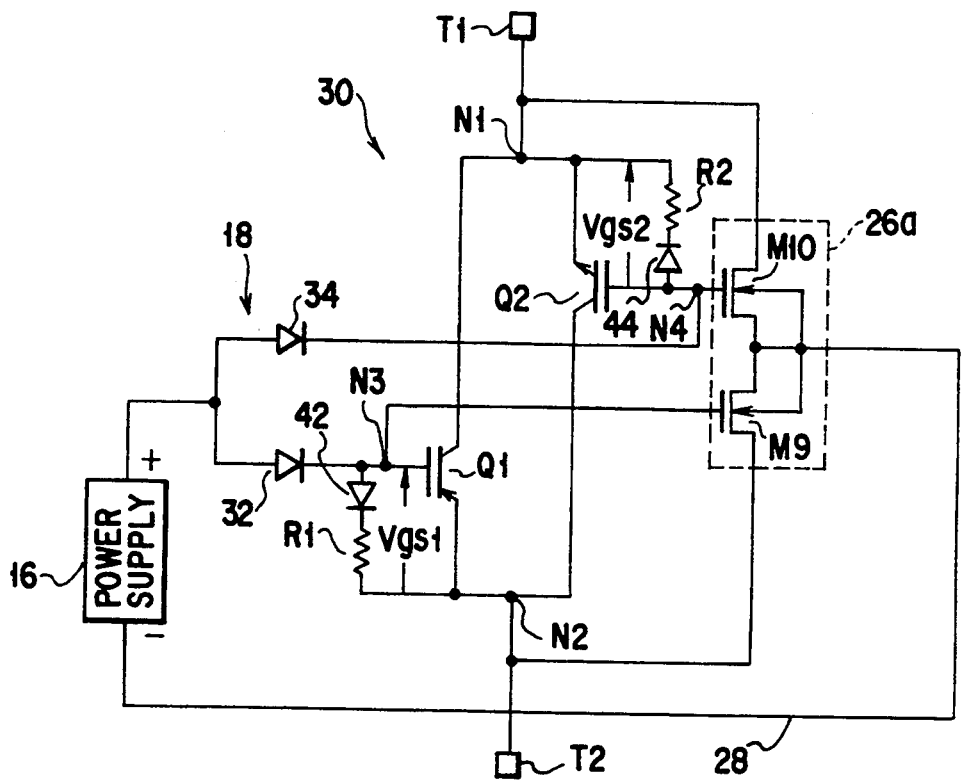

The detailed circuit configuration of the embodiment 30 of FIG. 2 is illustrated in FIG. 10, wherein the first selector 18 is similar to that of FIG. 3, and the second selector 26a includes N-channel type MOSFETs M10. The gate electrode of MOSFET M9 is coupled to the insulated gate of the IGBT switch device Q1 at the node N3. The gate of MOSFET M10 is connected to the insulated gate of the IGBT switch device Q2 at the node N4. The bias circuit voltage generator 22 coupled with device Q1 includes a diode 42 coupled between node N3 and resistor R1. The bias circuit voltage generator 24 includes a diode 44 coupled between node N4 and resistor R2. Adding of diodes 42, 44 is aimed at preventing the potentials at terminals t1, T2 from being applied to the gate electrodes of MOSFETs M9, M10.

With such an arrangement, when the potential at the terminal T1 is higher than that of terminal T2, the diode 32 becomes in the forward-biased state. The diode 34 is reverse biased. When the control current is supplied from the power supply 16, the current flows by way of the forward-biased diode 32. The unidirectional IGBT switch device Q1 and MOSFET M7 are activated simultaneously, causing terminals T1, T2 to be short-circuited to each other.

Figure 11:
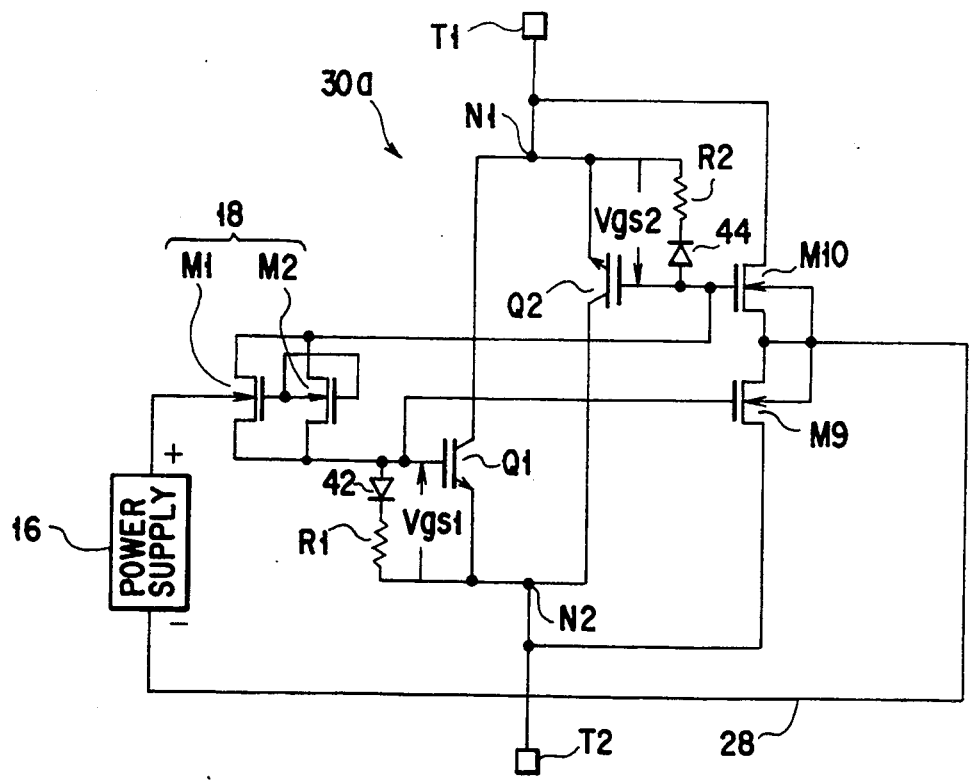
Figure 12:
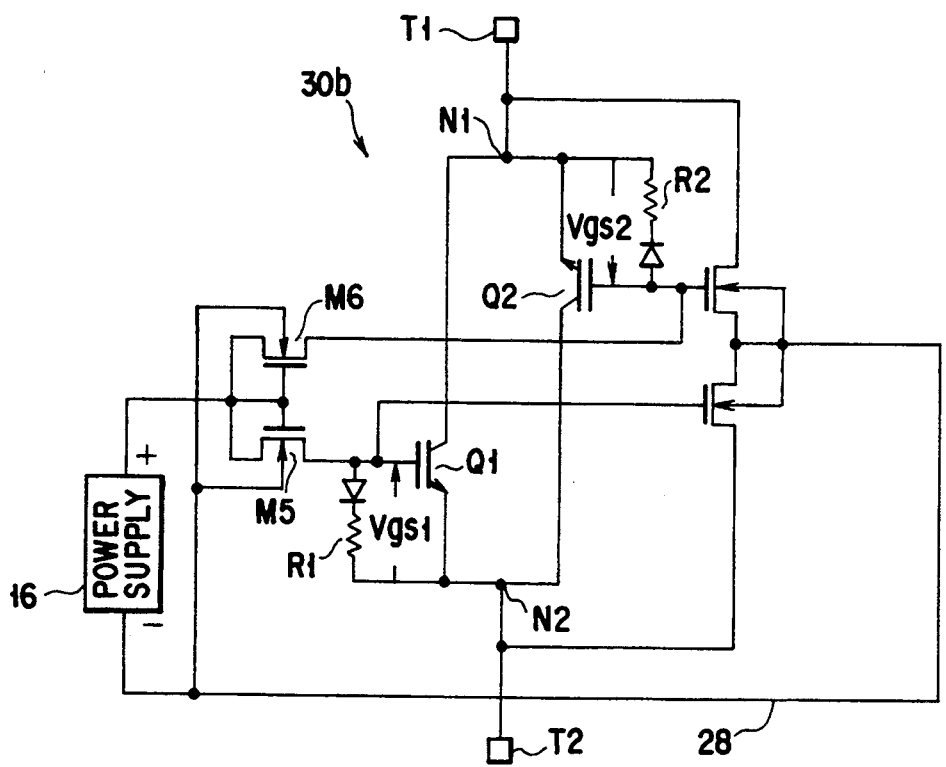

A bidirectional switch circuit 30a shown in FIG. 11 is similar to that of FIG. 10 with the diodes 32, 34 being replaced by the MOSFETs M1, M2 shown in FIG. 4. A bidirectional switch circuit 30b shown in FIG. 12 is similar to that of FIG. 10 with the diodes 32, 34 being replaced by the MOSFETs M5, M6 of FIG. 6.

The present invention is not limited to the abovedescribed specific embodiments and may be practiced or embodied in still other ways without departing from the spirit or essential character thereof. For example, the unidirectional switch devices used in the previously described circuits may be replaced with other types of transistors which are functionally equivalent thereto.

What is claimed is:

1. An integrated circuit for connection to a first and a second external terminal, said circuit comprising:

a first unidirectional switch device coupled between the first and second terminals, said first switch device being turned on or off in accordance with a potential difference between said first and second terminals;

a second unidirectional switch device connected in parallel with the first switch device, said second switch device being turned on or off in accordance with said potential difference between said first and second terminals, the first and second switch devices being connected reverse to each other in a current-forwarding direction thereof;

return-path selector means connected to said first and second terminals and having an output connected to a power supply device, for providing, in accordance with said potential difference between said first and second terminals, a return-path by which a return-current thereof is fed back from said output to the power supply device, said return-path selector means including a third switch device and a fourth switch device which are turned on selectively such that while one of the third and fourth switch devices is turned on, the other of said third and fourth switch devices is turned off;

current-flow selector means connected to said first and second switch devices, for receiving an output current of said power supply device, and for causing the output current to be provided unidirectionally to said first and second switch devices; and bias means connected to said first and second switch devices, for providing said first and second switch devices with bias voltages respectively in response to said output current of said power supply device, wherein said first and second switch devices include transistors, and said third and fourth switch devices include transistors which are connected with each other to form a flipflop circuit.

2. The circuit according to claim 1, wherein said current-flow selector means includes:

circuitry means for preventing a current from reverse-flowing from said first and second switch devices toward said power supply device, and for preventing a current from flowing between said first and second switch devices through said first current flow controller means.

3. The circuit according to claim 2, wherein said return-path selector means:

operates to prevent a current from reverse-flowing from said power supply device to the first and second terminals, and to prevent a current from flowing between said first and second switch devices through said return-path selector means.

4. The circuit according to claim 1, wherein said return-path selector means causes one of the first and second terminals which is less in potential than the other to be used as a part of said return path.

5. The circuit according to claim 1, wherein said current-flow selector means is coupled to said first and second switch devices at switching control terminals thereof.

6. The circuit according to claim 1, wherein said current-flow selector means includes a plurality of diodes.

7. The circuit according to claim 1, wherein said current-flow selector means includes a plurality of transistors.

8. The circuit according to claim 1, wherein said first and second switch devices include insulated gate bipolar transistors.

9. The circuit according to claim 1, wherein said power supply device includes a power supply unit of floating type.

* * * * *